United States Patent
Wu

(10) Patent No.: US 11,643,729 B2
(45) Date of Patent: May 9, 2023

(54) PEROVSKITE FILM, METHOD OF PREPARING THEREOF, AND OPTOELECTRONIC DEVICE

(71) Applicant: Shenzhen China Star Optoelectronics Semiconductor Display Technology Co., Ltd., Shenzhen (CN)

(72) Inventor: Yongwei Wu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 660 days.

(21) Appl. No.: 16/624,927

(22) PCT Filed: Nov. 15, 2019

(86) PCT No.: PCT/CN2019/118745
§ 371 (c)(1),
(2) Date: Dec. 20, 2019

(87) PCT Pub. No.: WO2021/056758
PCT Pub. Date: Apr. 1, 2021

(65) Prior Publication Data
US 2021/0210689 A1 Jul. 8, 2021

(30) Foreign Application Priority Data
Sep. 26, 2019 (CN) .......................... 201910916495.1

(51) Int. Cl.
*C23C 18/12* (2006.01)
*C08J 5/18* (2006.01)
*C09K 11/08* (2006.01)
*H01L 51/50* (2006.01)

(52) U.S. Cl.
CPC ............. *C23C 18/1295* (2013.01); *C08J 5/18* (2013.01); *C09K 11/0816* (2013.01); *C09K 11/0833* (2013.01); *C23C 18/1204* (2013.01); *C23C 18/125* (2013.01); *H01L 51/5056* (2013.01); *C08J 2300/10* (2013.01); *H01L 2251/303* (2013.01)

(58) Field of Classification Search
CPC ............. C23C 18/1204; C23C 18/125; C23C 18/1295; C09K 11/0833
See application file for complete search history.

(56) References Cited

U.S. PATENT DOCUMENTS

2018/0298278 A1* 10/2018 Zhong .................. C09K 11/664

FOREIGN PATENT DOCUMENTS

| CN | 105906807 A | * | 8/2016 | ............. C08G 73/08 |
| WO | WO-2016083783 A1 | * | 6/2016 | ........... F16H 49/001 |

* cited by examiner

*Primary Examiner* — Nathan H Empie

(57) ABSTRACT

A perovskite film, method of preparing thereof, and an optoelectronic device are provided. They are prepared by steps including preparing a mixture containing a first monomer and a second monomer which can be crosslinked in situ; performing an annealing process, and the first monomer and the second monomer are reacted in situ to form a first polymer which combines with the perovskite crystal grains formed by the perovskite precursor and is concentrated at a crystal grain boundary of the perovskite crystal grains to passivate the perovskite crystal grain defects, and then a perovskite film is formed by curing.

7 Claims, 1 Drawing Sheet

Adding a first monomer and a second monomer into the perovskite precursor solution at a predetermined ratio, and stirring uniformly to form a first mixed solution, and the first mixed solution is prepared on the substrate. — S10

The substrate having the first mixed solution prepared on a surface of the substrate is annealed. The first monomer and the second monomer are reacted in situ to form a first polymer, the perovskite precursor solution forms perovskite crystal grains, and the first polymer is combined with the perovskite crystal grains and concentrated at a crystal grain boundary of the perovskite crystal grains. — S20

The first mixed solution is cured to form the perovskite film. — S30

| Adding a first monomer and a second monomer into the perovskite precursor solution at a predetermined ratio, and stirring uniformly to form a first mixed solution, and the first mixed solution is prepared on the substrate. | S10 |

| The substrate having the first mixed solution prepared on a surface of the substrate is annealed. The first monomer and the second monomer are reacted in situ to form a first polymer, the perovskite precursor solution forms perovskite crystal grains, and the first polymer is combined with the perovskite crystal grains and concentrated at a crystal grain boundary of the perovskite crystal grains. | S20 |

| The first mixed solution is cured to form the perovskite film. | S30 |

PEROVSKITE FILM, METHOD OF PREPARING THEREOF, AND OPTOELECTRONIC DEVICE

RELATED APPLICATIONS

This application is a National Phase of PCT Patent Application No. PCT/CN2019/118745 having International filing date of Nov. 15, 2019, which claims the benefit of priority of Chinese Patent Application No. 201910916495.5 filed on Sep. 26, 2019. The contents of the above applications are all incorporated by reference as if fully set forth herein in their entirety.

FIELD AND BACKGROUND OF THE INVENTION

The present invention relates to the field of optoelectronic device technology, and more particularly, to a perovskite film, a method of preparing thereof, and an optoelectronic device.

As a new generation of semiconductor materials, perovskite-based materials have shown great potential in the field of optoelectronic devices such as solar cells, displays, lighting equipment, lasers, and detectors. Meanwhile, most perovskite optoelectronic devices are manufactured based on A wet process, which is very beneficial for large-area, low-cost commercial production of devices.

Most reports show that perovskites are in the form of polycrystalline films. Therefore, the quality of the films formed by microscopic grain growth has a crucial influence on optoelectronic properties. For example, the grains do not completely cover the substrate, pinholes, and almost inevitable crystal grain boundary problems. Poor film quality tends to increase the probability of non-radiative recombination, which reduces luminescence properties and carrier mobility and causes degradation of materials. Generally, crystal grain boundaries in perovskite films have defects that become an unbeneficial factor and a source of perovskite degradation.

Additive engineering is the addition of another unreacted substance to the perovskite precursor solution to protect the crystal grain boundaries and passivate defects, and improve the stability of materials and devices. Currently, the additives mainly include small molecular compounds such as organic amines and ammonium salts. In addition, there are a small number of linear polymers used as additives in the application of perovskite solar cells, but the added polymers tend to form precipitates in the perovskite precursors. It is not good for subsequent solution processing.

Therefore, the prior art has drawbacks and is in urgent need of improvement.

SUMMARY OF THE INVENTION

A perovskite film, method of preparing thereof, and a photoelectric device are provided, which can solve the crystal grain boundary defects in the perovskite film and avoid forming precipitates in the perovskite precursors due to directly adding polymers. The precipitates in the perovskite precursors is disadvantageous for subsequent solution processing.

In order to solve the above problems, the technical solutions provided by the present invention are described as follows.

A method of preparing a perovskite film includes following steps:

step S10, adding a first monomer and a second monomer into a perovskite precursor solution at a predetermined ratio, and stirring uniformly to form a first mixed solution, and the first mixed solution is prepared on a substrate.

step S20, annealing the substrate having the first mixed solution prepared on a surface of the substrate, and the first monomer and the second monomer are reacted in situ to form a first polymer, the perovskite precursor solution forms perovskite crystal grains, and the first polymer is combined with the perovskite crystal grains and concentrated at a crystal grain boundary of the perovskite crystal grains; and step S30, curing the first mixed solution to form the perovskite film.

The first monomer and the second monomer are respectively represented by following structural formulas (I) and (II):

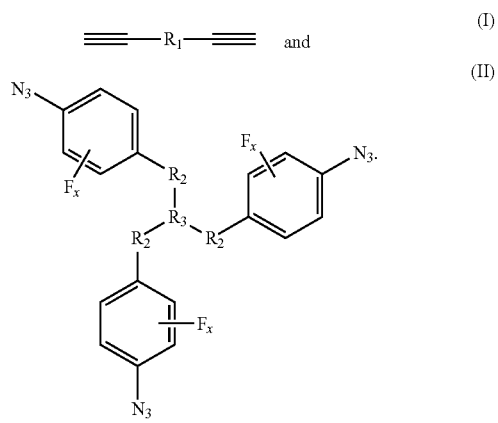

$R_1$ and $R_3$ are one of same or different branched alkyl groups having 3 to 20 carbon atoms, a branched amine group having 3 to 30 carbon atoms, a substituted or unsubstituted aromatic hydrocarbon group having 6 to 30 carbon atoms or a fused aromatic hydrocarbon group having 6 to 30 carbon atoms, and a substituted or unsubstituted heteroaromatic hydrocarbon group having 5 to 30 carbon atoms or a fused heterocyclic aromatic hydrocarbon group having 6 to 30 carbon atoms.

$R_2$ is a group containing at least one of O, N, and S atoms, $F_x$ is a fluorine atom bonded to a phenyl ring, x is a number of the fluorine atoms, and x is an integer of 2 to 4.

In one embodiment, the first polymer has structural formula (III) presented as follows:

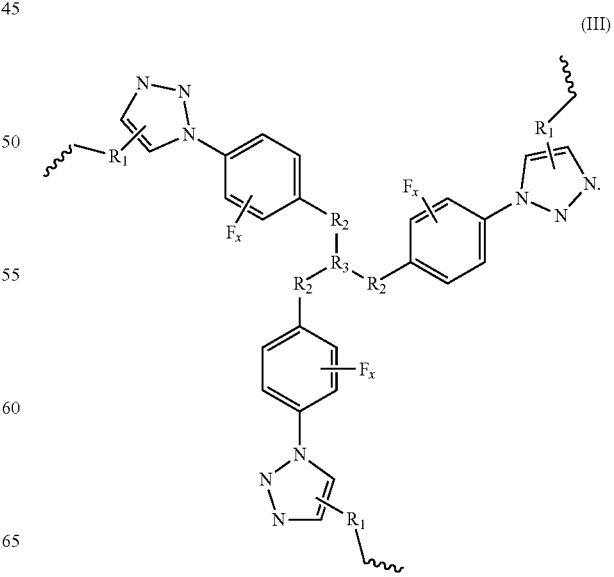

In one embodiment, the $R_1$ and the $R_3$ are selected from one of following chemical structural formulas:
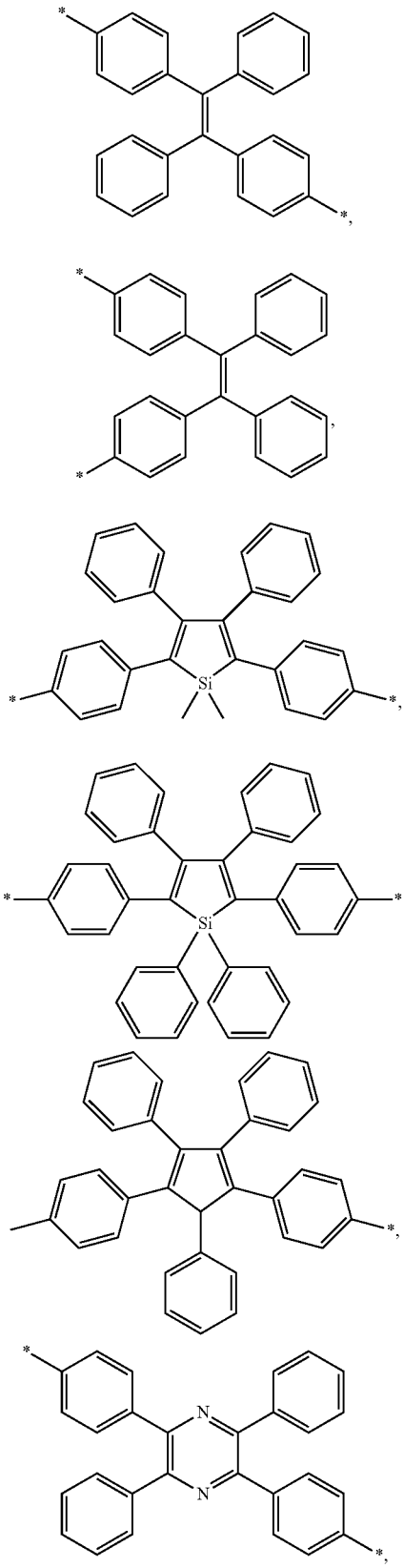
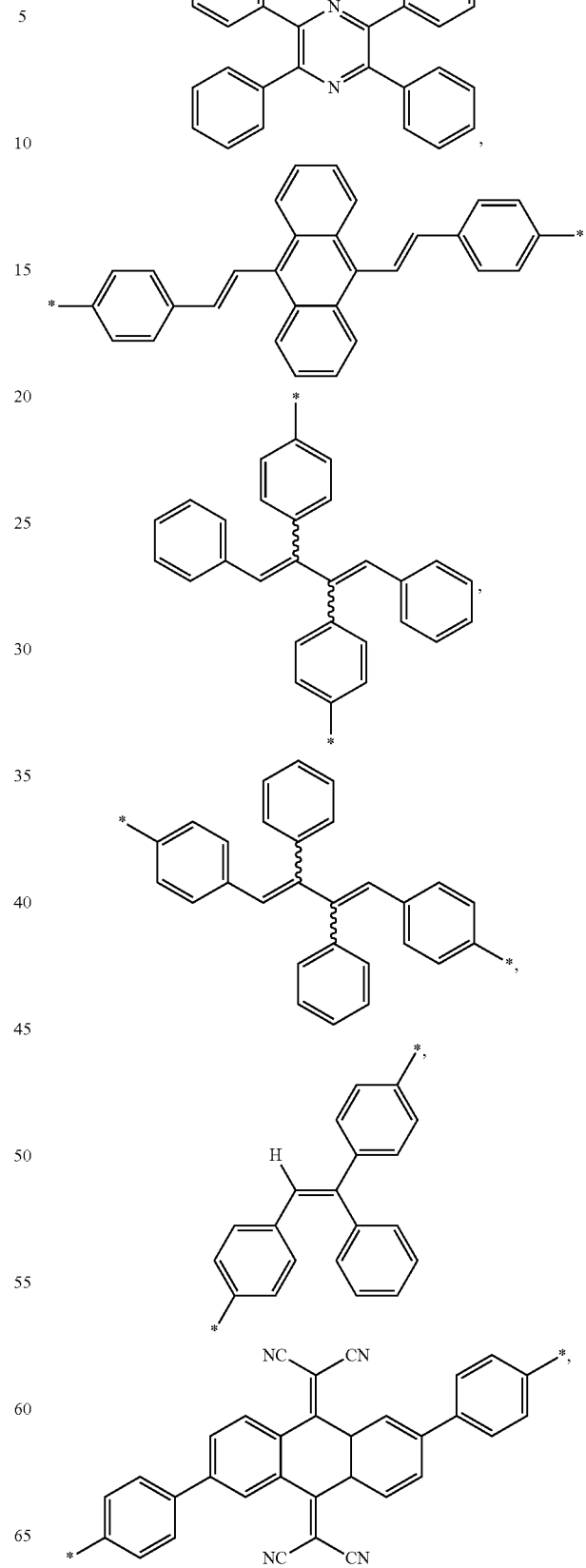
-continued

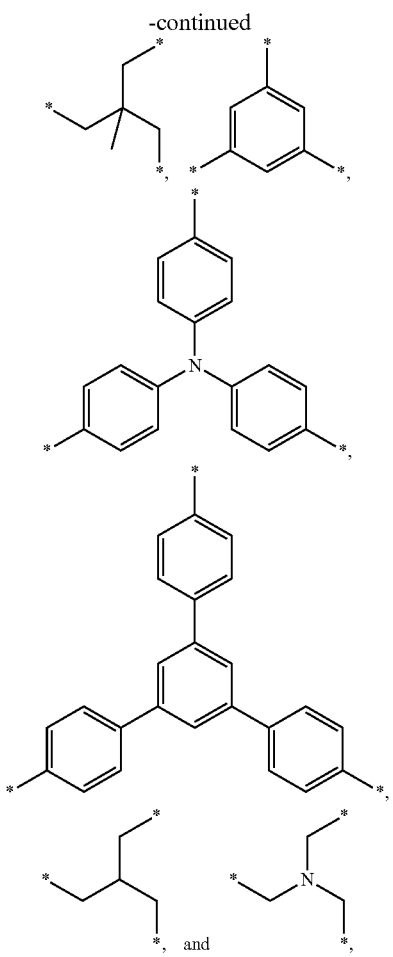

and * represents a substitution position.

In one embodiment, the R$_2$ is selected from any one of following structural formulas:

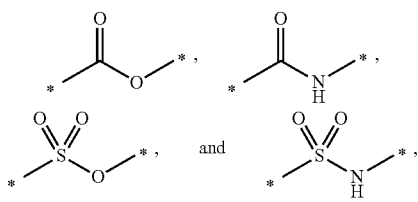

and * represents a substitution position.

In one embodiment, before the step S10, the method further includes following step:

step S101, dissolving compounds AX and BX$_2$ in the precursor solvent at a predetermined stoichiometric ratio, heating the precursor solvent to completely dissolve solid therein to form a solution containing a perovskite compound, and continuously stirring the solution to form the perovskite precursor solution. The perovskite compound has a molecular formula of ABX$_3$. A is a cation, the cation is selected from one of CH$_3$NH$_3^+$, NH$_2$CHNH$_2^+$, and Cs$^+$, or a mixture thereof; B is selected from one of Pb$^{2+}$ and Sn$^{2+}$, or a mixture thereof; and X is selected from one of I, Br, and Cl, or a mixture thereof.

In one embodiment, the precursor solvent is selected from one of N,N-dimethylformamide, dimethyl sulfoxide, and γ-butyrolactone, or a mixed solvent thereof.

In one embodiment, the first polymer comprises at least one atom containing a lone pair of electrons, the atom of the first polymer containing the lone pair of electrons forms a coordination with Pb$^{2+}$ and/or Sn$^{2+}$ in the perovskite grain, and at least a portion of the first polymer is enriched at the crystal grain boundary of the perovskite crystal grains.

A perovskite film is prepared by the above-mentioned method. The perovskite film is formed by atoms of first polymer containing the lone pair of electrons coordinating with Pb$^{2+}$ and/or Sn$^{2+}$ in perovskite crystal grains, the first polymer is enriched at a crystal grain boundary of the perovskite crystal grains, and the first polymer is a network crosslinked polymer formed by in situ reaction of a first monomer and a second monomer. The first monomer and the second monomer are respectively represented by following structural formulas (I) and (II):

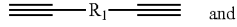 (I)

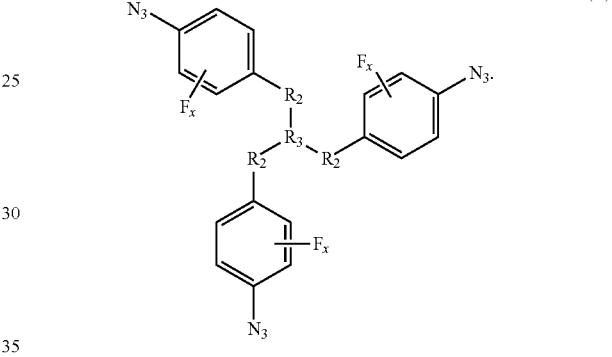 (II)

R$_1$ and R$_3$ are one of same or different branched alkyl groups having 3 to 20 carbon atoms, a branched amine group having 3 to 30 carbon atoms, a substituted or unsubstituted aromatic hydrocarbon group having 6 to 30 carbon atoms or a fused aromatic hydrocarbon group having 6 to 30 carbon atoms, and a substituted or unsubstituted heteroaromatic hydrocarbon group having 5 to 30 carbon atoms or a fused heterocyclic aromatic hydrocarbon group having 5 to 30 carbon atoms. R$_2$ is a group containing at least one of O, N, and S atoms, F$_x$ is a fluorine atom bonded to a phenyl ring, x is a number of the fluorine atoms, and x is an integer of 2 to 4.

An optoelectronic device includes the above-mentioned perovskite film, and the perovskite film is a functional layer disposed in the optoelectronic device.

In one embodiment, the functional layer disposed in the optoelectronic device is an electron transport layer or a hole transport layer.

The beneficial effects of the present invention are described. A perovskite film, a method of preparing thereof, and an optoelectronic device are provided.

In the embodiments of the present invention, a first monomer and a second monomer capable of forming a crosslinked polymer in situ are added into a perovskite precursor, and in the process of preparing the perovskite film, the first monomer and the second monomer are reacted in situ to form a first polymer, and are combined with the perovskite crystal grains and concentrated at the grain boundaries of the perovskite crystal grains, thereby passivating perovskite crystal grain defects. The first polymer formed by in-situ cross-linking polymerization can provide more effective hydrothermal and mechanical resistance than the small molecule and linear polymer additives. Meanwhile, the in-situ formation avoids the precipitation phenomenon of the perovskite precursor caused by directly adding the polymer additive.

BRIEF DESCRIPTION OF THE SEVERAL VIEWS OF THE DRAWING(S)

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

FIG. 1 is a flowchart of a method of preparing a perovskite film according to one embodiment of the present invention.

DESCRIPTION OF SPECIFIC EMBODIMENTS OF THE INVENTION

The following description of the various embodiments is provided to illustrate the specific embodiments of the present invention. Directional terms mentioned in the present invention, such as "upper," "lower," "front," "back," "left," "right," "inside," "outside," "side," etc., are merely references to the direction of the additional drawings. Therefore, the directional terms are used for illustrating and understanding of the application rather than limiting thereof. In the drawings, identical components are marked with the same reference numerals.

The present invention is directed to the prior art perovskite film in which the crystal grains do not completely cover the substrate, and it forms pinholes and defects at a crystal grain boundary of the perovskite crystal grains, thereby reducing luminescence properties and carrier mobility, and causing technical problems of material degradation. The embodiments of the present invention can solve the above-mentioned defects.

Referring to FIG. 1, it is a flowchart of a method of preparing a perovskite film according to one embodiment of the present invention. The method includes steps described as follows.

Step S10, adding a first monomer and a second monomer, which are crosslinked polymers formed in situ, into the perovskite precursor solution at a predetermined ratio, and stirring uniformly to form a first mixed solution, and the first mixed solution is prepared on the substrate.

Before the step S10, the method further includes step of preparing a perovskite precursor solution, and the step is described as follows.

Step S101, compounds AX and $BX_2$ in the precursor solvent are dissolved at a predetermined stoichiometric ratio, the precursor solvent is heated to 70° C. until to completely dissolve solid therein to form a solution containing a perovskite compound, and the solution is stirred continuously to form the perovskite precursor solution. The perovskite compound has a molecular formula of $ABX_3$, and A is a cation, the cation includes, but is not limited to, one of $CH_3NH_3^+$, $NH_2CHNH_2^+$, and $Cs^+$, or a mixture thereof. B includes, but is not limited to, one of $Pb^{2+}$ and $Sn^{2+}$, or a mixture thereof. X includes, but is not limited to, one of I, Br, and Cl, or a mixture thereof. The precursor solvent is selected from one of N,N-dimethylformamide, dimethyl sulfoxide, and γ-butyrolactone, or a mixed solvent thereof.

The first monomer and the second monomer are represented by following structural formulas (I) and (II), respectively:

$R_1$ and $R_3$ are one of same or different branched alkyl groups having 3 to 20 carbon atoms, a branched amine group having 3 to 30 carbon atoms, a substituted or unsubstituted aromatic hydrocarbon group having 6 to 30 carbon atoms or a fused aromatic hydrocarbon group having 6 to 30 carbon atoms, and a substituted or unsubstituted heteroaromatic hydrocarbon group having 5 to 30 carbon atoms or a fused heterocyclic aromatic hydrocarbon group having 5 to 30 carbon atoms. $R_2$ is a group containing at least one of O, N, and S atoms, $F_x$ is a fluorine atom bonded to a phenyl ring, x is a number of the fluorine atoms, and x is an integer of 2 to 4.

Specifically, the $R_1$ and the $R_3$ are selected from one of following chemical structural formulas:

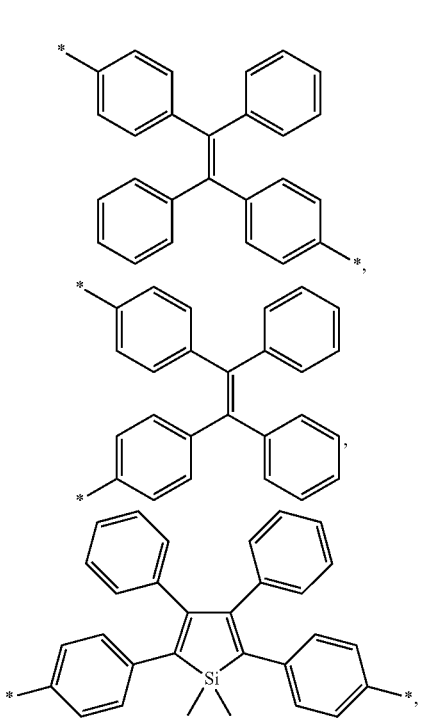

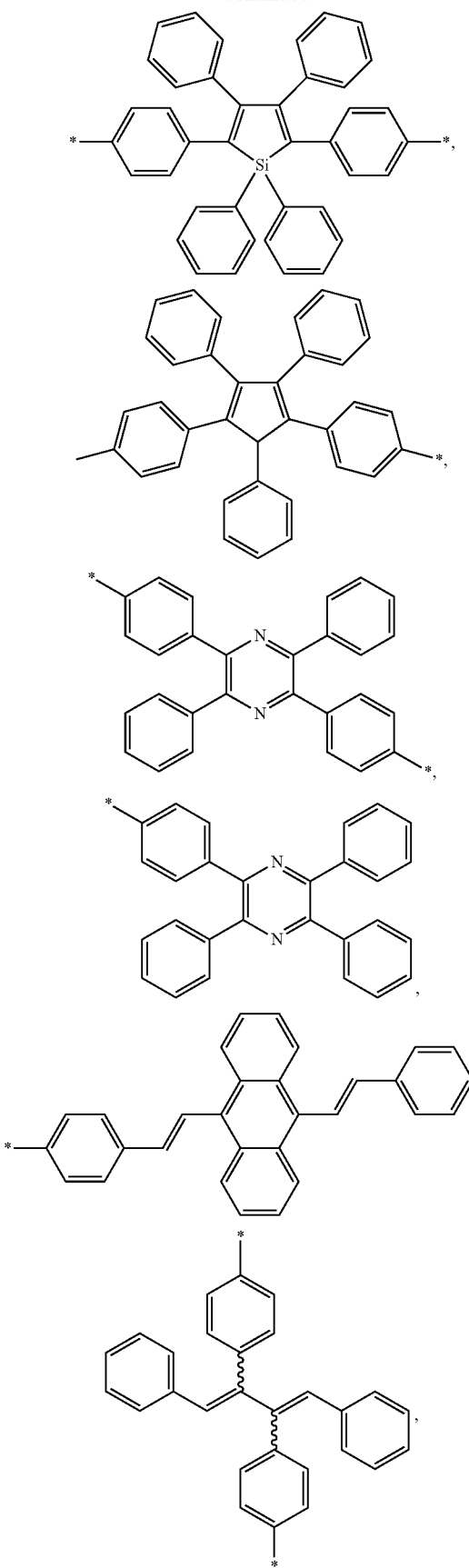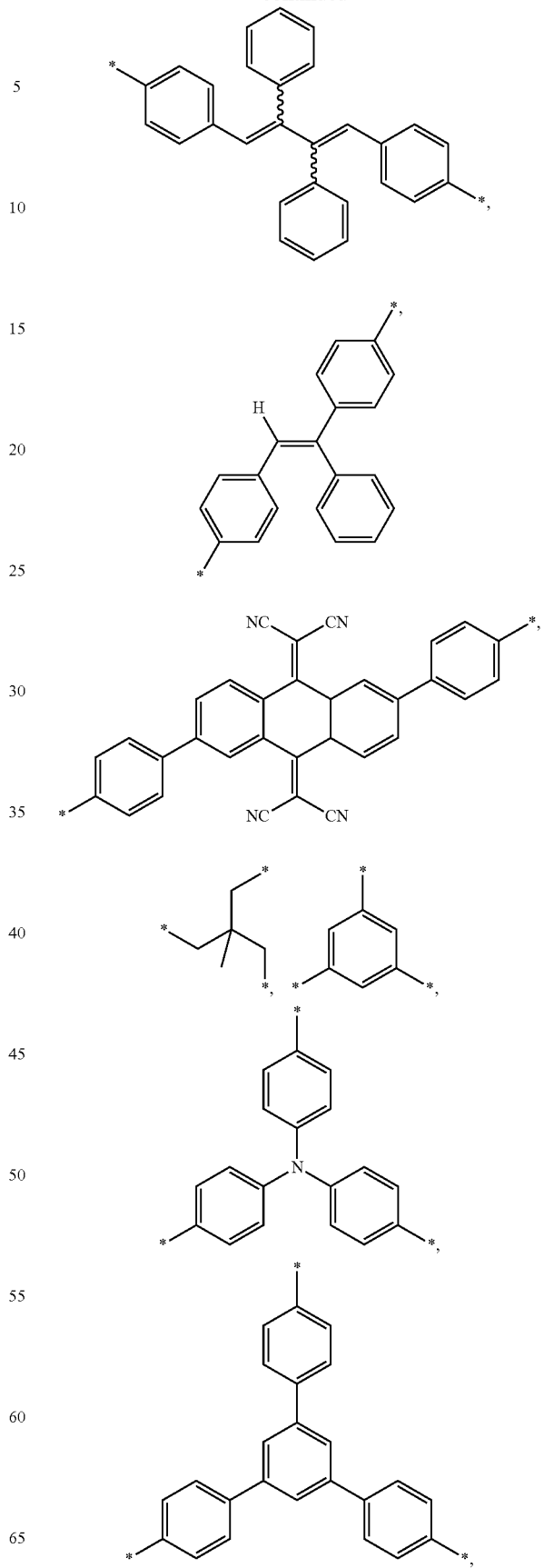

-continued

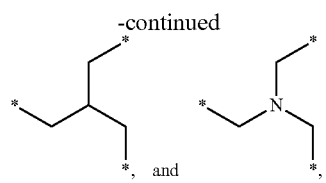

and * represents a substitution position.

The $R_2$ is selected from any one of following structural formulas:

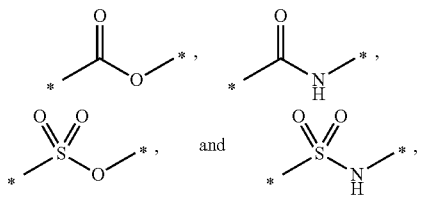

and * is represented substitution position.

Step S20, the substrate having the first mixed solution prepared on a surface of the substrate is annealed. The first monomer and the second monomer are reacted in situ to form a first polymer, the perovskite precursor solution forms perovskite crystal grains, and the first polymer is combined with the perovskite crystal grains and concentrated at a crystal grain boundary of the perovskite crystal grains.

Specifically, the first mixed solution is coated or inkjet printed on the substrate on which the perovskite film is to be prepared, and then annealed at a temperature of 40° C. to 150° C. for 5 minutes to 2 hours, or at room temperature for 2 hours to 20 hours. In the process, the added first monomer and the second monomer are reacted in situ to form a network of the first polymer, and the first polymer has a structural formula (III) presented as follows:

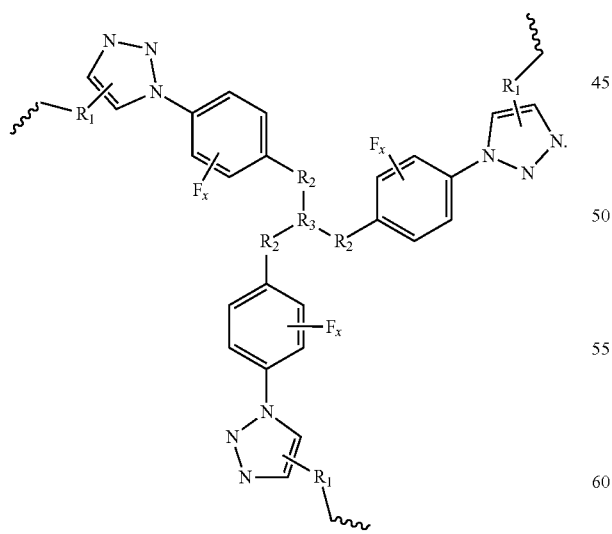

(III)

$R_1$ and $R_3$ are one of same or different branched alkyl groups having 3 to 20 carbon atoms, a branched amine group having 3 to 30 carbon atoms, a substituted or unsubstituted aromatic hydrocarbon group having 6 to 30 carbon atoms or a fused aromatic hydrocarbon group having 6 to 30 carbon atoms, and a substituted or unsubstituted heteroaromatic hydrocarbon group having 5 to 30 carbon atoms or a fused heterocyclic aromatic hydrocarbon group having 5 to 30 carbon atoms. $R_2$ is a group containing at least one of O, N, and S atoms, $F_x$ is a fluorine atom bonded to a phenyl ring, x is a number of the fluorine atoms, and x is an integer of 2 to 4.

Specifically, the $R_1$ and the $R_3$ are selected from one of following chemical structural formulas:

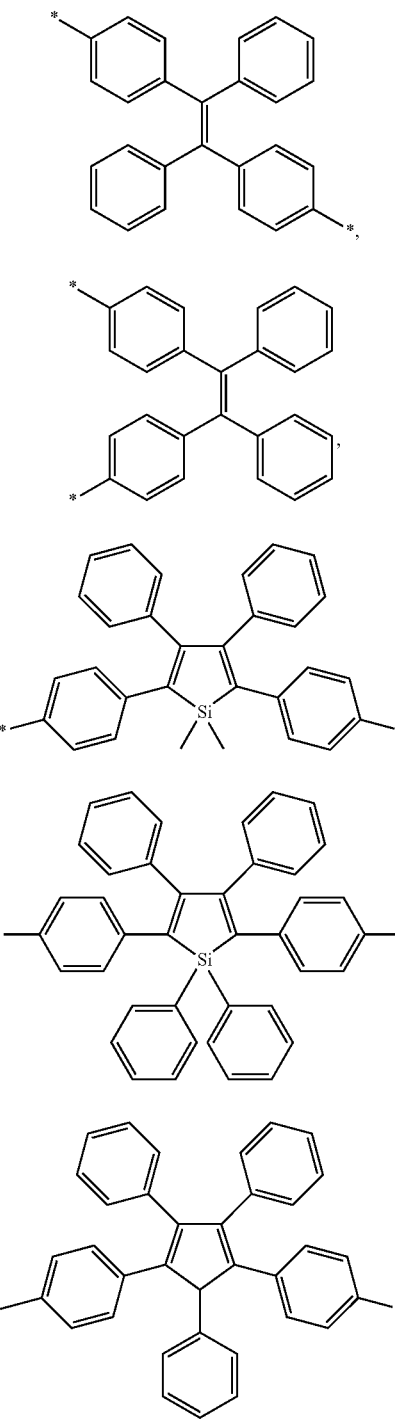

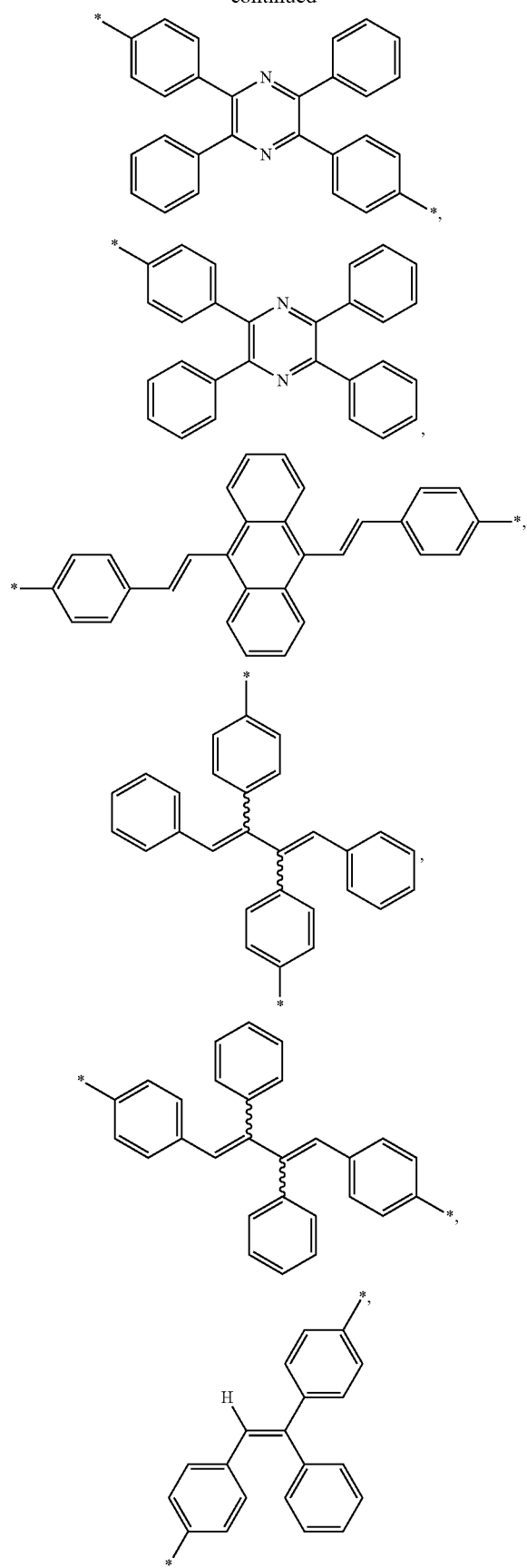

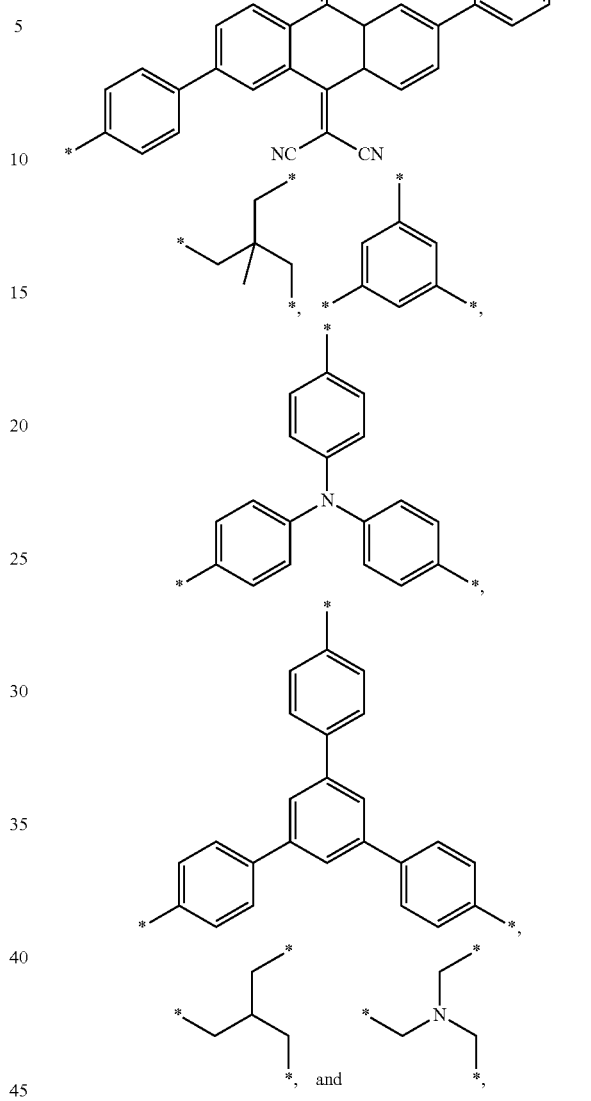

and * represents a substitution position.

The $R_2$ is selected from any one of following structural formulas:

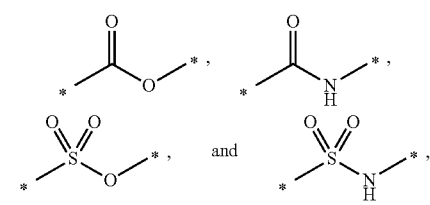

and * represents a substitution position.

Step S30, the first mixed solution is cured to form the perovskite film.

Since the first polymer has O, N, S, etc. with a lone pair of electron atoms, it is effectively interacted with the perovskite crystal grain, that is, the atom of the first polymer containing the lone pair of electrons forms a coordination with $Pb^{2+}$ and/or $Sn^{2+}$ in the perovskite grain, and at least a portion of the first polymer is enriched at the crystal grain boundary of the perovskite crystal grains, thereby increasing the binding ability of the first polymer to the perovskite crystallites. Among them, the first polymer concentrated at the grain boundary can effectively protect the grain boundary and passivate defects.

Since the current high-performance perovskite optoelectronic devices are manufactured based on organic ammonium ions ($CH_3NH_3^+$ or $NH_2CHNH_2^+$) perovskite films, these organic ammonium ions are lost or migrated during annealing or illumination work, which can generate a large number of defects due to the absence of organic ammonium ions. On the other hand, it can significantly reduce the efficiency of the device, and these defects provide a transport channel for cation migration and accelerate ion migration, thereby reducing stability of device.

According to the method one embodiment of the present invention, the introduction of the first monomer and the second monomer in situ cross-linking polymerization avoids the precipitation phenomenon of the perovskite precursor caused by directly adding the polymer additive. Since the organic cation in the perovskite forms a chemical bond with the first polymer by coordination, the defects caused by the cation volatilization during the annealing process are greatly reduced, thereby improving the charge transfer efficiency of the device during working. The device efficiency and repetition properties are greatly improved. Since the chemical bond is strong, the cation is firmly held, thereby inhibiting migration and significantly improving the stability of the device.

The embodiment also introduces fluorine-containing groups into the perovskite precursor, and the fluorine-containing groups are self-distributed at the crystal grain boundary after forming film, thereby improving the hydrophobic ability of the perovskite material from the grain boundary. The fluorine-containing groups is crosslinked at the crystal grain boundaries of the perovskite crystal grains, which can improve the film-forming quality of the perovskite material, while utilizing the hydrophobicity of the fluorine-containing groups to improve the stability of the perovskite film, and the doped fluorine-containing groups increase their optoelectronic properties.

In the embodiments, the first polymer has three major functions. First, it is "in situ" to protect the crystal grain boundary and passivate defects. Second, it prevents external moisture, air, etc. from infiltrating the perovskite. Third, it inhibits the ion, which is mainly $Pb^{2+}$, $X^-$, migration inside the perovskite film because the crystal grain boundary is the most important channel for ion migration in the perovskite film. The first polymer formed by in-situ cross-linking polymerization can provide more effective hydrothermal and mechanical resistance than the small molecule and linear polymer additives.

In another embodiment, a perovskite film is prepared by the above-mentioned method. The perovskite film is formed by atoms of first polymer containing the lone pair of electrons coordinating with $Pb^{2+}$ and/or $Sn^{2+}$ in perovskite crystal grains, the first polymer is enriched at a crystal grain boundary of the perovskite crystal grains, and the first polymer is a network crosslinked polymer formed by in situ reaction of a first monomer and a second monomer. The structural formulas of the first monomer, the second monomer, and the first polymer are respectively shown in the structural formulas (I) to (III) in the above embodiments. For details, refer to the above embodiments, and the description is not be repeated here.

In another embodiment, an optoelectronic device includes the above perovskite film is also provided. The optoelectronic device includes, but is not limited to, a perovskite light emitting diode, a perovskite solar cell, a perovskite color film, a perovskite laser, a perovskite detector, a perovskite scintillator, etc. The perovskite film is a functional layer in the optoelectronic device.

In one embodiment, the functional layer disposed in the optoelectronic device is an electron transport layer or a hole transport layer.

In the embodiments of the present invention, a first monomer and a second monomer capable of forming a crosslinked polymer in situ are added into a perovskite precursor, and in the process of preparing the perovskite film, the first monomer and the second monomer are reacted in situ to form a first polymer, and are combined with the perovskite crystal grains and concentrated at the grain boundaries of the perovskite crystal grains, thereby passivating perovskite crystal grain defects.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of preparing a perovskite film, comprising following steps:
   step S10, adding a first monomer and a second monomer into a perovskite precursor solution at a predetermined ratio, and stirring uniformly to form a first mixed solution, wherein the first mixed solution is prepared on a substrate;
   step S20, annealing the substrate having the first mixed solution prepared on a surface of the substrate, wherein the first monomer and the second monomer are reacted in situ to form a first polymer, the perovskite precursor solution forms perovskite crystal grains, and the first polymer is combined with the perovskite crystal grains and concentrated at a crystal grain boundary of the perovskite crystal grains; and
   step S30, curing the first mixed solution to form the perovskite film;
   wherein the first monomer and the second monomer are respectively represented by following structural formulas (I) and (II):

and

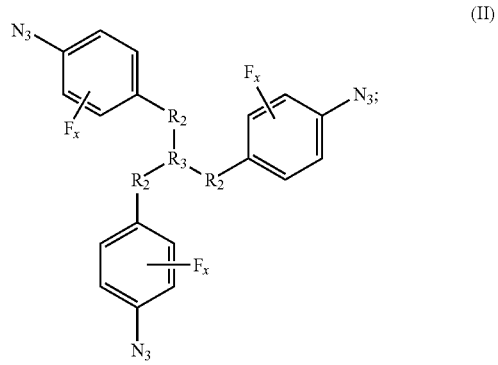

wherein $R_1$ and $R_3$ are one of same or different branched alkyl groups having 3 to 20 carbon atoms, a branched amine group having 3 to 30 carbon atoms, a substituted or unsubstituted aromatic hydrocarbon group having 6 to 30 carbon atoms or a fused aromatic hydrocarbon group having 6 to 30 carbon atoms, and a substituted or unsubstituted heteroaromatic hydrocarbon group having 5 to 30 carbon atoms or a fused heterocyclic aromatic hydrocarbon group having 6 to 30 carbon atoms; and wherein $R_2$ is a group containing at least one of O, N, and S atoms, $F_x$ is a fluorine atom bonded to a phenyl ring, x is a number of the fluorine atoms, and x is an integer of 2 to 4.

2. The method of preparing the perovskite film according to claim 1, wherein the first polymer has structural formula (III) presented as follows:

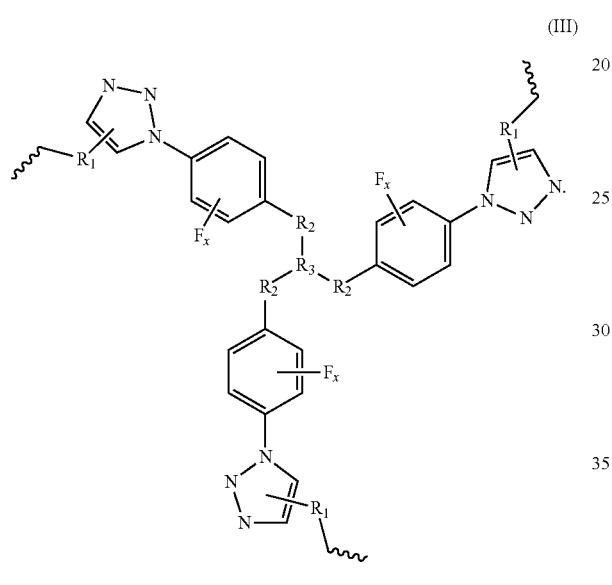

(III)

3. The method of preparing the perovskite film according to claim 1, wherein the $R_1$ and the $R_3$ are selected from one of following chemical structural formulas:

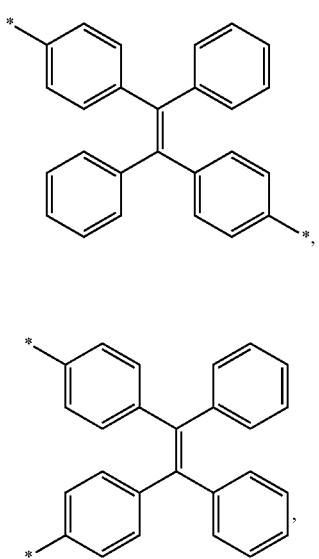

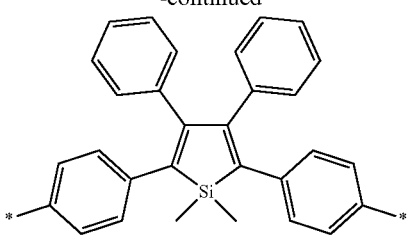

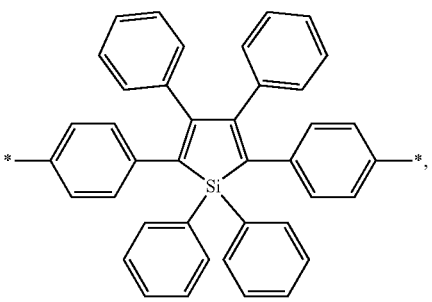

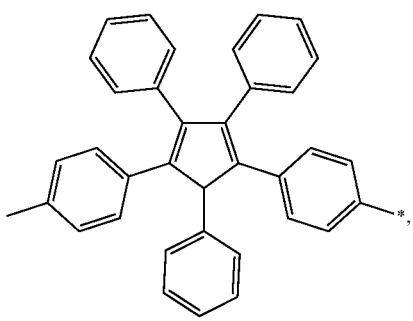

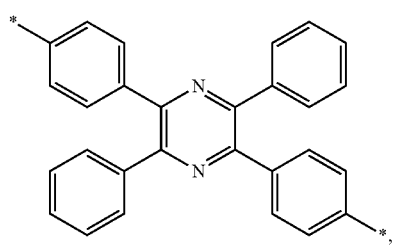

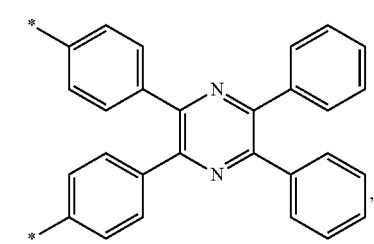

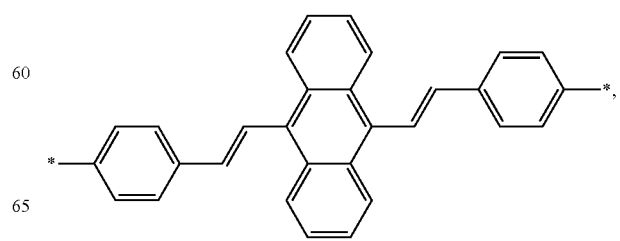

-continued

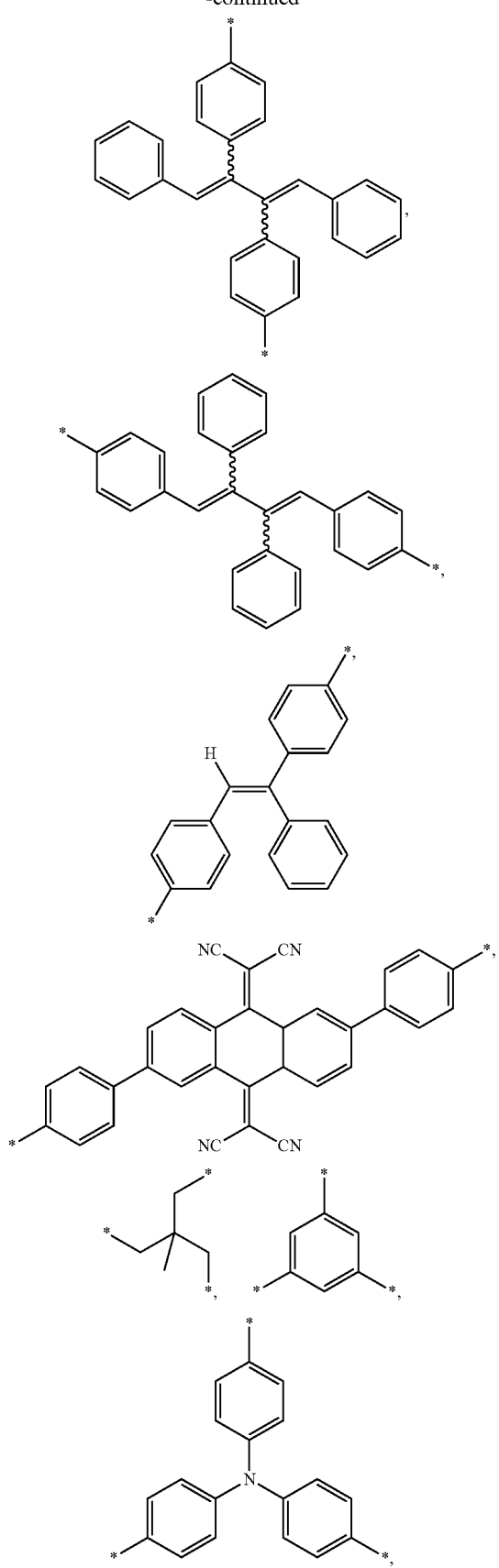

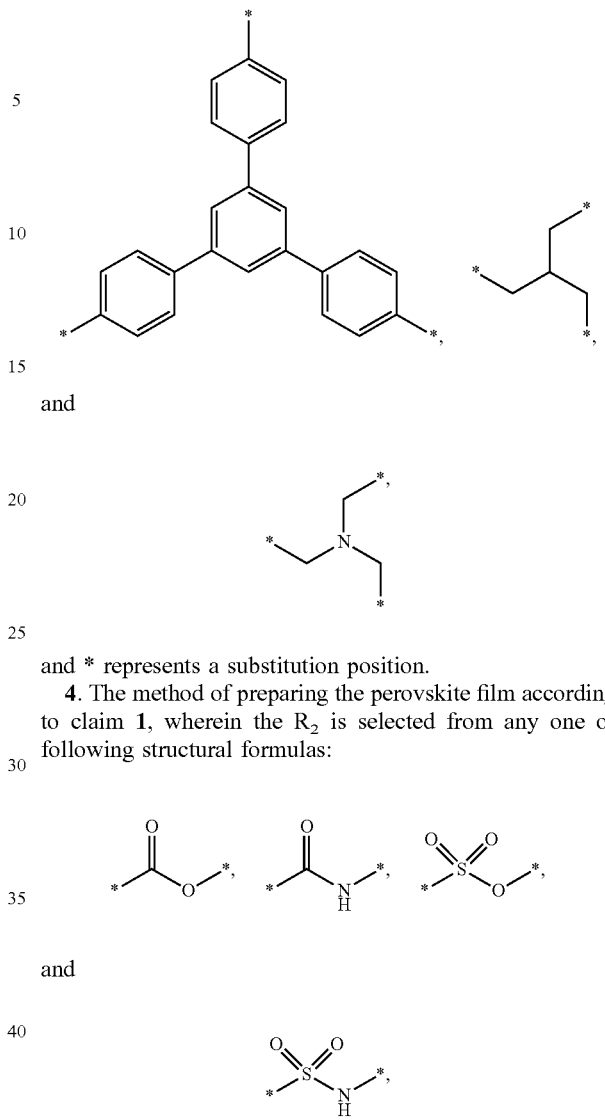

and and * represents a substitution position.

4. The method of preparing the perovskite film according to claim 1, wherein the $R_2$ is selected from any one of following structural formulas:

and and * represents a substitution position.

5. The method of preparing the perovskite film according to claim 1, wherein before the step S10, the method further comprises following step:

step S101, dissolving compounds AX and $BX_2$ in the precursor solvent at a predetermined stoichiometric ratio, heating the precursor solvent to completely dissolve solid therein to form a solution containing a perovskite compound, and continuously stirring the solution to form the perovskite precursor solution;

wherein the perovskite compound has a molecular formula of $ABX_3$; and wherein A is a cation, the cation is selected from one of $CH_3NH_3^+$, $NH_2CHNH_2^+$, and $Cs^+$, or a mixture thereof; B is selected from one of $Pb^{2+}$ and $Sn^{2+}$, or a mixture thereof; and X is selected from one of I, Br, and Cl, or a mixture thereof.

6. The method of preparing the perovskite film according to claim 5, wherein the precursor solvent is selected from one of N,N-dimethylformamide, dimethyl sulfoxide, and γ-butyrolactone, or a mixed solvent thereof.

7. The method of preparing the perovskite film according to claim 5, wherein the first polymer comprises at least one atom containing a lone pair of electrons, the atom of the first polymer containing the lone pair of electrons forms a coordination with $Pb^{2+}$ and/or $Sn^{2+}$ in the perovskite grain, and at least a portion of the first polymer is enriched at the crystal grain boundary of the perovskite crystal grains.

\* \* \* \* \*